United States Patent
Song et al.

(10) Patent No.: US 9,564,908 B2
(45) Date of Patent: Feb. 7, 2017

(54) DIGITAL PHASE-LOCKED LOOP AND METHOD OF OPERATING THE SAME

(71) Applicant: Samsung Electronics Co., Ltd., Suwon-si, Gyeonggi-do (KR)

(72) Inventors: Min-young Song, Suwon-Si (KR); Tae-ik Kim, Seongnam-si (KR); Ji-hyun Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/955,802

(22) Filed: Dec. 1, 2015

(65) Prior Publication Data

US 2016/0164527 A1    Jun. 9, 2016

(30) Foreign Application Priority Data

Dec. 3, 2014 (KR) .................. 10-2014-0172388

(51) Int. Cl.
| | |
|---|---|
| H03L 7/06 | (2006.01) |
| H03L 7/081 | (2006.01) |
| H03L 7/099 | (2006.01) |
| H03L 7/095 | (2006.01) |
| H03L 7/08 | (2006.01) |

(52) U.S. Cl.
CPC ........... *H03L 7/0814* (2013.01); *H03L 7/0802* (2013.01); *H03L 7/095* (2013.01); *H03L 7/0992* (2013.01)

(58) Field of Classification Search
USPC .................................. 327/147–149, 156–158
See application file for complete search history.

(56) References Cited

U.S. PATENT DOCUMENTS

| | | | |
|---|---|---|---|
| 6,823,033 | B2 | 11/2004 | Fahim |
| 7,276,978 | B2 | 10/2007 | Puma et al. |
| 7,613,267 | B2 | 11/2009 | Perrott et al. |
| 7,759,993 | B2 | 7/2010 | Zhang |
| 7,868,672 | B2 | 1/2011 | Geng et al. |
| 7,911,247 | B2 | 3/2011 | Xu et al. |
| 8,138,840 | B2 | 3/2012 | Ainspan et al. |
| 8,222,966 | B2 | 7/2012 | Ravi et al. |

(Continued)

OTHER PUBLICATIONS

Wooseok Kim et al., "Layout Synthesis and Loop Parameter Optimization of a Low-Jitter All-Digital Pixel Generator", IEEE Journal of Solid-State Circuits, Mar. 2014, pp. 657-672, vol. 49.

(Continued)

*Primary Examiner* — Adam Houston
(74) *Attorney, Agent, or Firm* — Harness, Dickey & Pierce, P.L.C.

(57) ABSTRACT

Provided are a digital phase-locked loop (DPLL) having improved signal characteristics, and a method of operating the DPLL. The DPLL includes a first tracking unit configured to receive a reference signal and a feedback signal that is generated by feeding back an output signal of the DPLL, track the feedback signal, and output a delayed reference signal, and a second tracking unit configured to receive a delayed feedback signal generated by delaying the feedback signal, and the delayed reference signal, and generate an output signal of the DPLL, of which a frequency is controlled according to a phase difference between the delayed feedback signal and the delayed reference signal.

20 Claims, 14 Drawing Sheets

(56) References Cited

U.S. PATENT DOCUMENTS

| | | | |
|---|---|---|---|
| 8,400,197 B2 | 3/2013 | Romano et al. | |
| 8,704,567 B2 | 4/2014 | Ainspan et al. | |
| 8,717,073 B2 | 5/2014 | Ichikawa | |
| 8,736,384 B2 | 5/2014 | Ravi et al. | |
| 8,791,733 B2 | 7/2014 | Tertinek et al. | |
| 8,878,614 B2* | 11/2014 | Yin | H03L 7/099 327/147 |
| 2010/0073054 A1* | 3/2010 | Bereza | H03L 7/093 327/159 |
| 2010/0123488 A1* | 5/2010 | Palmer | H03L 7/1976 327/115 |
| 2010/0148881 A1* | 6/2010 | Moussavi | H03L 7/0814 331/36 C |
| 2013/0113536 A1* | 5/2013 | Sfikas | H03L 7/091 327/158 |
| 2014/0191787 A1* | 7/2014 | Xing | H03L 7/093 327/157 |
| 2015/0222284 A1* | 8/2015 | Evans | H03L 7/081 327/107 |
| 2016/0118990 A1* | 4/2016 | Faisal | H03K 5/134 327/156 |

OTHER PUBLICATIONS

Tae-Kwang Jang et al., "A 0.016mm2 5.3mW 32-to-20000MHz Digital Fractional-N Phase Locked-Loop Using a Phase-Interpolating Phase to Digital Coverter", IEEE Journal of Solid-State Circuits, 2013, pp. 254-266, IEEE Journal of Solid State Circuits, 2013, pp. 254-266, IEEE Z. Ru et al., "A 12GHz 210fs 6mW Digital PLL with Sub-sampling Binary Phase Detector an Voltage-Time Modulated DCO", Symposium on VLSI Circuits Digest of Technical Papers, 2013, pp. C194-C195.

Jri Lee et al, "Analysis and Modeling of Bang-Bang Clock and Data Recovery Circuits", IEEE Journal of Solid-State Circuits, Sep. 2004, pp. 1571-1580, vol. 39, IEEE.

\* cited by examiner

FIG. 9

$$G_0 = \frac{K_{bbpd}}{K_{acc}} \times K_{dcdl}$$

$$G_0(z) = K_{bbpd} \times K_{dlf} \times \frac{K_{dco} \times z^{-1}}{1-z^{-1}}$$

$$H_{ref}(z) = \frac{N \times G_0(z)}{G_0(z) + \frac{1+G(z)}{G(z)}}$$

$$H_{dco}(z) = \frac{1}{1+G(z) \times [1+G_0(z)]}$$

DIGITAL PHASE-LOCKED LOOP AND METHOD OF OPERATING THE SAME

CROSS-REFERENCE TO RELATED APPLICATION

This application claims the benefit of Korean Patent Application No. 10-2014-0172388, filed on Dec. 3, 2014, in the Korean Intellectual Property Office, the disclosure of which is incorporated herein in its entirety by reference.

BACKGROUND

Example embodiments of the inventive concepts relate to a digital phase-locked loop (DPLL). For example, at least some example embodiments relate to a DPLL having improved signal characteristics and/or a method of operating the same.

A phase-locked loop (PLL) may be a control circuit configured to generate an output clock signal having a phase related to a phase of an input clock signal. The output clock signal generated by the PLL may be a system clock signal used for various digital products. A digital PLL (DPLL) that is based on digital control may be used as an example of the PLL. Performance of the DPLL may be degraded due to a noise of the output signal.

SUMMARY

Example embodiments of the inventive concepts provide a digital phase-locked loop (DPLL), which may improve characteristics of an output signal, and a method of operating the same.

According to an example embodiment of the inventive concepts, a DPLL may include a first tracking unit configured to receive a reference signal and a feedback signal generated by feeding back an output signal of the DPLL, and to output a delayed reference signal by tracking the feedback signal, and a second tracking unit configured to receive the delayed reference signal and a delayed feedback signal generated by delaying the feedback signal, and to generate the output signal of the DPLL, wherein a frequency of the output signal of the DPLL is controlled according to a phase difference between the delayed feedback signal and the delayed reference signal.

The first tracking unit may include a first bangbang phase detector (BBPD) configured to detect a phase difference between the reference signal and the feedback signal, and a first delay-controlled delay line (DCDL) configured to generate the delayed reference signal by delaying the reference signal, based on the phase difference detected by the first BBPD.

The first tracking unit may further include an accumulation circuit configured to receive a detection signal from the first BBPD, and provide a control signal for delaying the reference signal to the first DCDL in response to the detection signal.

The second tracking unit may include a second BBPD configured to detect a phase difference between the delayed feedback signal and the delayed reference signal, and a digitally controlled oscillator (DCO) configured to generate the output signal of which the frequency is controlled, based on the phase difference detected by the second BBPD.

The second tracking unit may further include a second DCDL configured to generate the delayed feedback signal by delaying the feedback signal.

The second tracking unit may further include a digital loop filter (DLF) configured to receive a detection signal from the second BBPD and provide a control signal for controlling the frequency of the output signal to the DCO in response to the detection signal.

The DPLL may further include a main divider configured to generate the feedback signal by dividing the output signal of the DPLL.

The DPLL may further include a lock detector configured to detect whether the DPLL is in a lock state and generate a lock detection signal, and an automatic frequency control (AFC) circuit configured to control the frequency of the output signal based on a phase difference between the reference signal and the feedback signal.

The lock detection signal may be provided to the first tracking unit, and the first tracking unit may perform a tracking operation when the DPLL is in the lock state.

The delayed reference signal output by the first tracking unit has a constant delay amount with respect to the reference signal when the DPLL is in a unlock state. The delayed reference signal output by the first tracking unit has a variable delay amount with respect to the reference signal based on a tracking result when the DPLL is in a lock state.

According to another example embodiment of the inventive concepts, a DPLL may include: a feed-forward delay-locked part (FFDLP) configured to receive a reference signal and a feedback signal by feeding back an output signal of the DPLL, and to output a delayed reference signal, and a phase-locked part (PLP) configured to receive the delayed reference signal and a delayed feedback signal generated by delaying the feedback signal, and to generate the output signal of the DPLL. The FFDLP is enabled when the DPLL is in a lock state, and provides the delayed reference signal by tracking the feedback signal to an input of the PLP.

BRIEF DESCRIPTION OF THE DRAWINGS

Example embodiments of the inventive concepts will be more clearly understood from the following detailed description taken in conjunction with the accompanying drawings in which:

FIG. 9 shows equations indicating operating characteristics of a DPLL to which a secondary sigma modulation is applied, according to an example embodiment of the inventive concepts;

DETAILED DESCRIPTION

Figure 1:
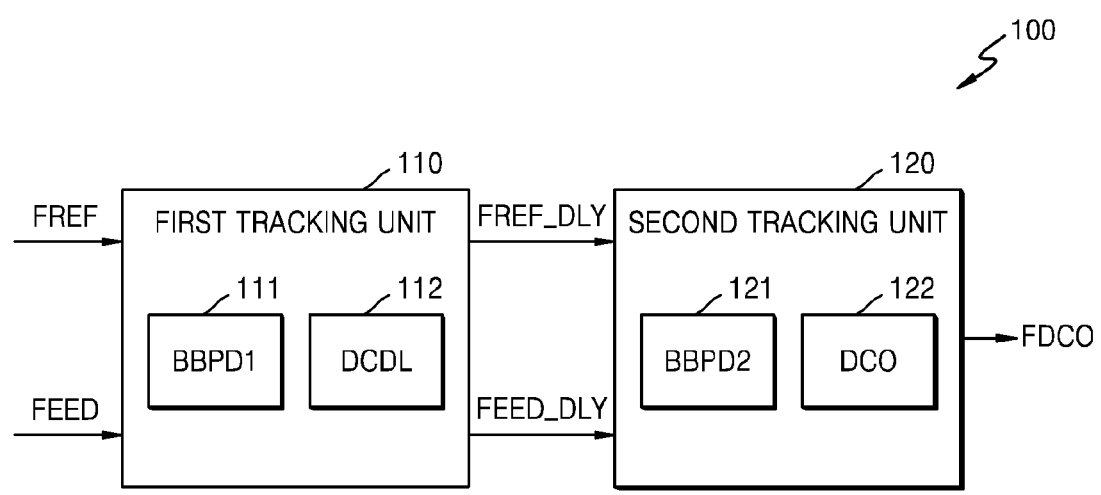
FIG. 1 is a block diagram of a digital phase-locked loop (DPLL) according to an example embodiment of the inventive concepts.

Example embodiments of the inventive concepts will now be described more fully hereinafter with reference to the accompanying drawings, in which some example embodiments of the inventive concepts are shown. These example embodiments are provided so that this disclosure is thorough and complete and fully conveys the scope of the example embodiments of the inventive concepts to one skilled in the art. Accordingly, while example embodiments of the inventive concepts can be modified in various ways and take on various alternative forms, specific embodiments thereof are shown in the drawings and described in detail below as examples. There is no intent to limit example embodiments of the inventive concepts to the particular forms disclosed. On the contrary, example embodiments of the inventive concepts are to cover all modifications, equivalents, and alternatives falling within the spirit and scope of the appended claims. Like reference numerals refer to like elements throughout. In the drawings, the thicknesses of layers and regions may be exaggerated for clarity.

The terminology used herein is for the purpose of describing particular example embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless explicitly so defined herein.

As used herein, the term "and/or" includes any and all combinations of one or more of the associated listed items.

FIG. 1 is a block diagram of a digital phase-locked loop (DPLL) 100 according to an example embodiment of the inventive concepts.

As shown in FIG. 1, the DPLL 100 according to the example embodiment of the inventive concepts may include at least two tracking units, for example, a first tracking unit 110 and a second tracking unit 120. Each of the first and second tracking units 110 may receive two input signals, compare phases and/or frequencies of the two input signals, and generate an output signal tracked to at least one of the two input signals.

The first tracking unit 110 may include a first phase detector 111 and a delay-controlled delay line (DCDL) 112. Also, the second tracking unit 120 may include a second phase detector 121 and a digitally controlled oscillator (DCO) 122. Although FIG. 1 illustrates only some elements of the DPLL 100, various other function blocks of the DPLL 100 may be further illustrated in FIG. 1.

Meanwhile, FIG. 1 illustrates an example in which a bangbang phase detector (BBPD) is applied as the first phase detector 111 and the second phase detector 121, but example embodiments of the inventive concepts are not limited thereto. In another case, each of the first phase detector 111 and the second phase detector 121 may be referred to as a bangbang phase-frequency detector (BBPFD) and described as being configured to detect a phase and/or a frequency.

Each of the first tracking unit 110 and the second tracking unit 120 may receive two input clock signals, detect a phase difference between the two input clock signals, and control an output signal based on a detection result (or depending on which of the two input clock signals has a phase that leads a phase of the other input clock signal).

The first tracking unit 110 may receive a reference clock signal (hereinafter, referred to as a reference signal) FREF and a feedback output clock signal (hereinafter, referred to as a feedback signal) FEED, which is generated by feeding back an output signal of the DPLL 100, and detect a phase difference between the reference signal FREF and the feedback signal FEED. The first tracking unit 110 may delay the reference signal FREF and output the delayed signal based on a detection result. For example, the first tracking unit 110 may delay the reference signal FREF, generate a delayed reference signal FREF_DLY that is tracked to the feedback signal FEED, and provide the delayed reference signal FREF_DLY to the second tracking unit 120.

The first phase detector 111 may compare a phase and/or frequency of the reference signal FREF with a phase and/or frequency of the feedback signal FEED and generate a comparison result. Hereinafter, it will be assumed that each of the first and second phase detectors 111 and 121 of FIG. 1 compares phases of input signals. The DCDL 112 may perform a signal delay operation in response to a control signal (not shown) based on a detection result of the first phase detector 111. For example as described above, the DCDL 112 may delay the reference signal FREF and generate a delayed reference signal FREF_DLY.

Meanwhile, the second tracking unit 120 may receive a delayed reference signal FREF_DLY and a delayed feedback signal FEED_DLY and detect a phase difference between the delayed reference signal FREF_DLY and the delayed feedback signal FEED_DLY. Although FIG. 1 illustrates the delayed feedback signal FEED_DLY is being transmitted from the first tracking unit 110 to the second tracking unit 120, example embodiments are not limited thereto. For example, a signal generated by dividing and delaying the output signal of the DCO 122 may be directly provided as the delayed feedback signal FEED_DLY to the second tracking unit 120. The second tracking unit 120 may control and output a phase and/or frequency of the output signal FDCO of the DPLL 100 based on a result of detection of the phase difference. The output signal FDCO may be tracked to the delayed reference signal FREF_DLY.

The second phase detector 121 may compare a phase of the delayed feedback signal FEED_DLY with a phase of the delayed reference signal FREF_DLY and generate a comparison result. The DCO 122 may generate an output signal FDCO of which a phase and/or a frequency is controlled, in response to a control signal (not shown) that is based on a detection result of the second phase detector 121.

According to the DPLL 100 shown in FIG. 1, even if a BBPD having a non-linear characteristic is applied as a phase detector, an in-band noise of the DPLL 100 may be efficiently reduced. For example, conventionally, when the output signal FDCO is controlled according to a phase difference between the reference signal FREF and the feedback signal FEED, and a relatively large and fast jitter occurs in the output signal FDCO in the DPLL 100 to which the BBPD is applied, a tracking jitter to which the reference signal FREF cannot be tracked to the output signal FDCO may be generated.

In contrast, in the DPLL 100 according to one or more example embodiments, the delayed reference signal FREF_DLY, which is tracked to the output signal FDCO including the jitter, may be generated due to a delay operation of the DCDL 112 that is based on the jitter in the output signal FDCO. Also, since the frequency and/or phase of the output signal FDCO is controlled based on a result of tracking of the delayed reference signal FREF_DLY, a phase noise of the output signal FDCO of the DPLL 100 may be reduced.

Furthermore, the DPLL 100 according to example embodiments of the inventive concepts may improve characteristics of the output signal FDCO without high power/voltage consumption, and maintain high stability.

Figure 2:
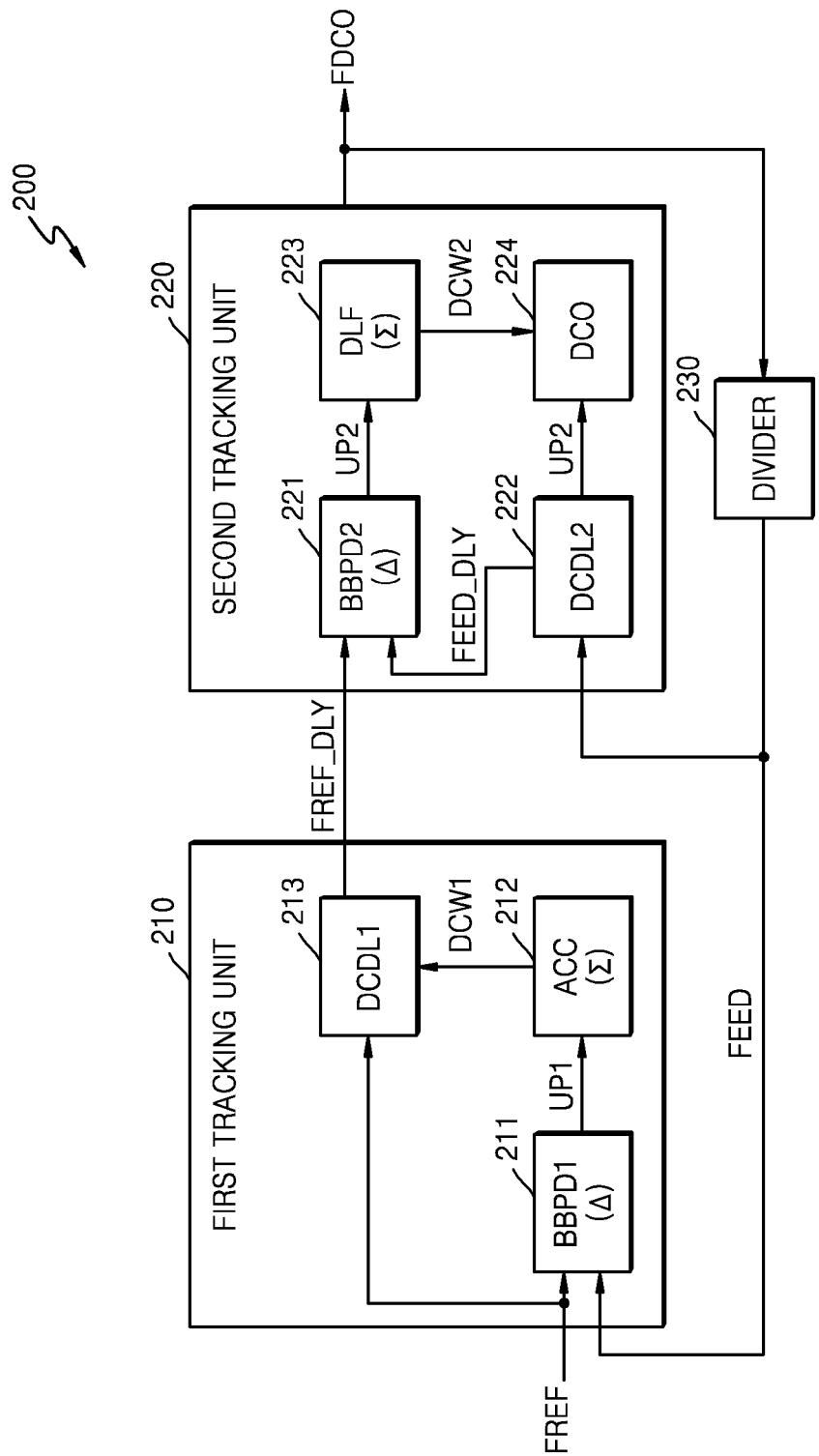
FIG. 2 is a block diagram of a DPLL according to another example embodiment of the inventive concepts.

FIG. 2 is a block diagram of a DPLL 200 according to other example embodiments of the inventive concepts.

As shown in FIG. 2, the DPLL 200 may include at least two tracking units, for example, a first tracking unit 210 and a second tracking unit 220. The DPLL 200 may further include a divider 230 that may divide an output signal FDCO of the DPLL 200 and transmit the divided signal as a feedback signal FEED.

The first tracking unit 210 may include a first phase detector 211, an accumulation circuit 212, and a first delay-controlled delay line (DCDL) 213.

The second tracking unit 220 may include a second phase detector 221, a second DCDL 222, a digital loop filter (DLF) 223, and a digitally controlled oscillator (DCO) 224. Also, FIG. 2 illustrates an example in which a BBPD is applied as each of the first and second phase detectors 211 and 221, but example embodiments of the inventive concepts are not limited thereto. As described above, the BBPD may be referred to as a BBPFD. Also, the accumulation circuit 212 of FIG. 2 may be one of various kinds of circuits configured to generate a result signal based on an accumulation operation on input signals. For example, the accumulation circuit 212 may be the same as or similar to the DLF 223 included in the second tracking unit 220.

Furthermore, each of the first tracking unit 210 and the second tracking unit 220 may detect a difference (delta, Δ) between two input signals to detect which one of the two input signals has a phase that leads or lags behind a phase of the other input signal, and perform an accumulation (sigma, Σ) operation on a detection result. Thus, each of the first tracking unit 210 and the second tracking unit 220 may be assumed to perform a delta-sigma modulation function. Also, the DPLL 200 according to example embodiments may be assumed to be a secondary sigma loop in which each of the first tracking unit 210 and the second tracking unit 220 performs a sigma operation.

The first phase detector 211 may receive a reference signal FREF and the feedback signal FEED, which is generated by dividing the output signal FDCO, and generate a first detection signal UP1 based on a phase detection result. The accumulation circuit 212 may generate a first control signal DCW1 for controlling a delay amount of the first DCDL 213 in response to the first detection signal UP1. The first DCDL 213 may delay the reference signal FREF and generate and output a delayed reference signal FREF_DLY according to a value (e.g., digital value) of the first control signal DCW1. The feedback signal FEED may include a jitter caused to the output signal FDCO, and the delayed reference signal FREF_DLY may be tracked to the feedback signal FEED including the jitter.

The delayed reference signal FREF_DLY may be transmitted from the first tracking unit 210 to a reference input terminal of the second tracking unit 220. Thus, the second tracking unit 220 may perform a tracking operation using the delayed reference signal FREF_DLY. The second DCDL 222 may receive the feedback signal FEED, delay the feedback signal FEED, and generate a delayed feedback signal FEED_DLY. The second phase detector 211 may receive the delayed reference signal FREF_DLY and the delayed feedback signal FEED_DLY, and generate a second detection signal UP2 based on a phase detection result. While FIG. 2 illustrates that the second DCDL 222 is included in the second tracing unit 220, in other example embodiments, the second DCDL 222 may be included in the first tracking unit 210 or included outside the first tracking unit 210 and the second tracking unit 220.

The DLF 223 may generate a second control signal DCW2 in response to the second detection signal UP2, and the DCO 224 may generate an output signal FDCO, a phase and/or frequency of which is controlled in response to the second control signal DCW2. When a phase difference between the delayed feedback signal FEED_DLY, which is caused by the output signal FDCO, and the delayed reference signal FREF_DLY satisfies a desired (or, alternatively, a predetermined) allowable error, a frequency of the output signal FDCO may be fixed.

According to the above-described example embodiment, the first DCDL 112 may generate a delayed reference signal FREF_DLY, which fluctuates with a jitter in the feedback signal FEED. Thus, a value |FREF_DLY-FEED_DLY|, which corresponds to an input tracking jitter due to the two input signals of the second tracking unit 220, may be reduced based on a resolution of the first DCDL 112. Thus, a phase noise of the DPLL 200 may be reduced.

Figure 3:
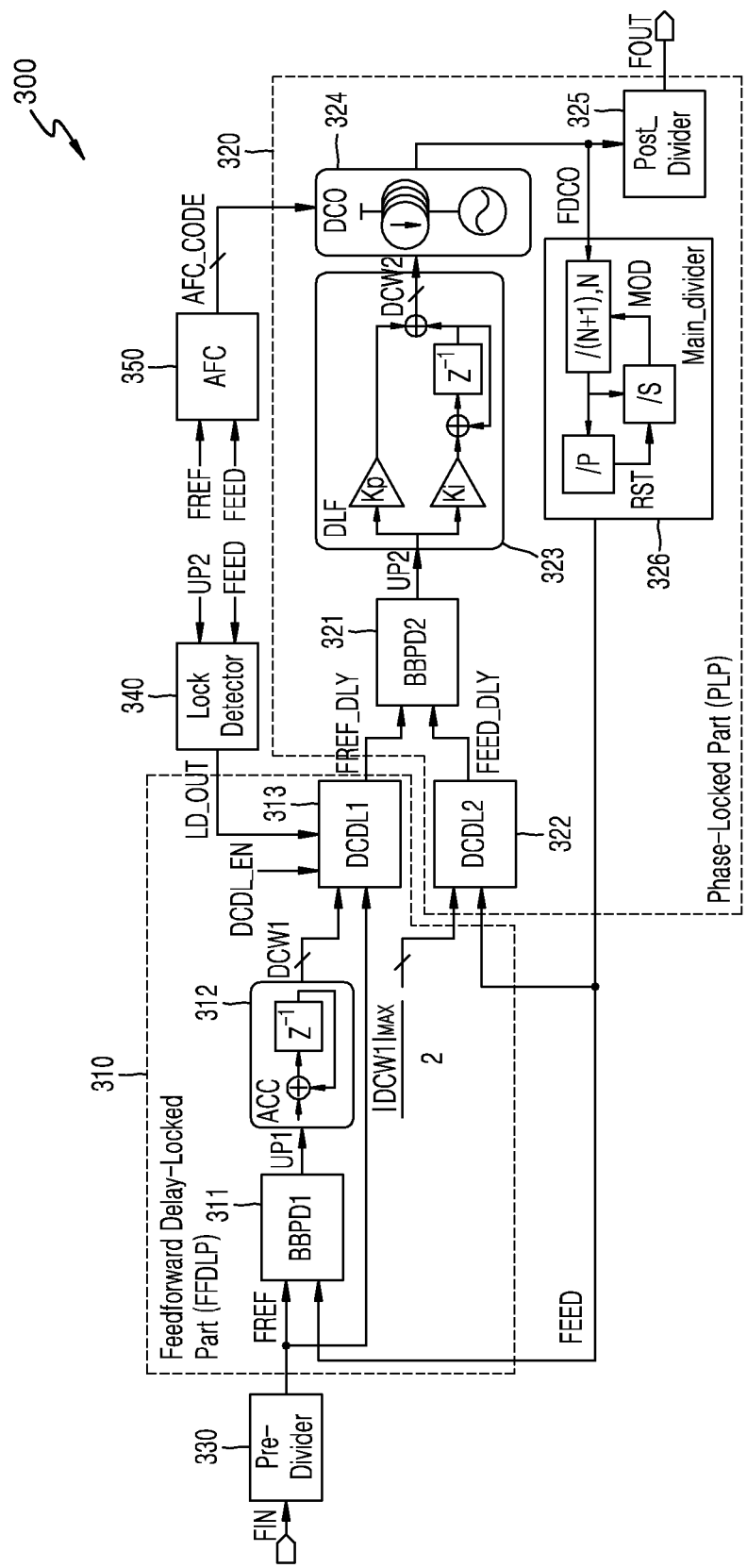
FIG. 3 is a detailed block diagram of a DPLL according to an example embodiment of the inventive concepts.
Figure 4:
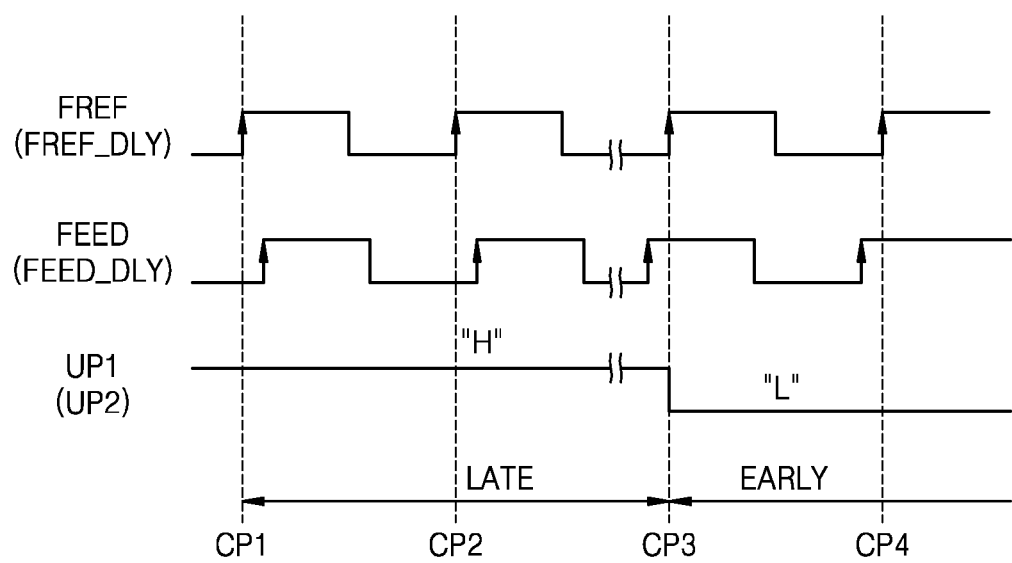
FIGS. 4 and 5 are waveform diagrams of various signals shown in FIG. 3, according to example embodiment of the inventive concepts.
Figure 5:
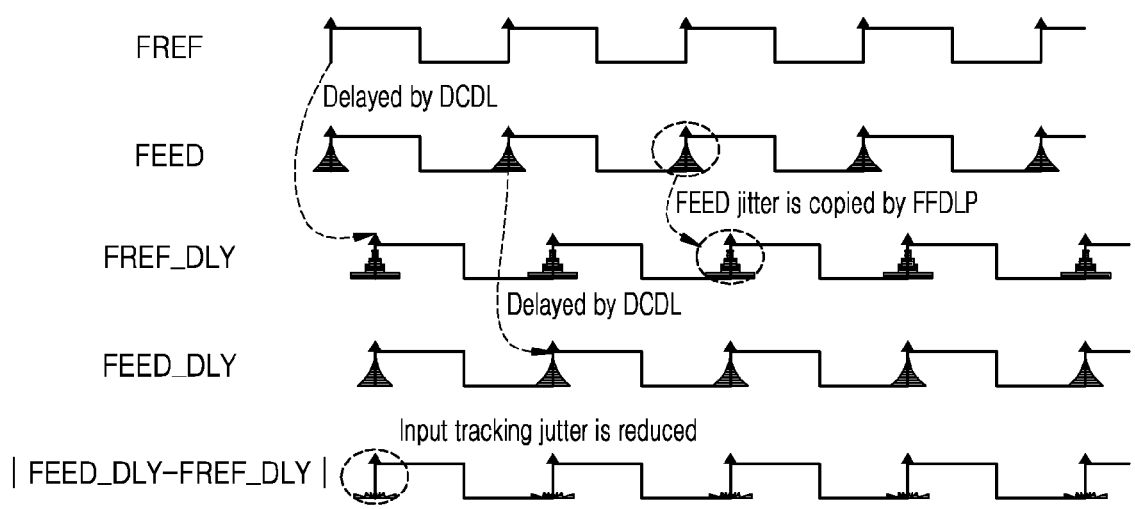

FIG. 3 is a detailed block diagram of a DPLL 300 according to an example embodiment of the inventive concepts. FIGS. 4 and 5 are waveform diagrams of various signals shown in FIG. 3, according to example embodiments of the inventive concepts.

Referring to FIG. 3, as in the above-described example embodiment, since a secondary sigma loop is applied to the DPLL 300, the DPLL 300 may include at least two tracking units.

For example, a front-end loop 310 may be defined as a feed-forward delay-locked part (FFDLP), and a rear-end loop 320 may be defined as a phase-locked part (PLP). Also, internal elements of the FFDLP and the PLP are not limited to the illustrated example embodiment but may be variously designed and modified. For example, the second DCDL 322 shown in FIG. 3 may be included in the FFDLP or included outside the FFDLP and the PLP.

The DPLL 300 may include the FFDLP 310, a phase-locked part (PLP) 320, a pre-divider 330, a lock detector 340, and an automatic frequency control (AFC) circuit 350. Also, the FFDLP 310 may include a first bangbang phase detector (BBPD) 311, which is a phase detector, an accumulation circuit 312, and a first delay-controlled delay line (DCDL) 313. Also, the PLP 320 may include a second BBPD 321, a second DCDL 322, a digital loop filter (DLF) 323, and a digitally controlled oscillator (DCO) 324. Also, the PLP 320 may further include a post-divider 325 and a main divider 326.

Each of the first BBPD 311 and the second BBPD 321 may detect a phase difference between two input signals, and output a detection signal based on a detection result. Each of the first BBPD 311 and the second BBPD 321 may output a different detection signals depending on a late state or an early state. An input clock signal FIN may be transmitted through the pre-divider 330 and applied as a reference signal FREF to the first BBPD 311. Also, an output signal FDCO may be transmitted through the main divider 326 and applied as a feedback signal FEED to the first BBPD 311.

The first BBPD 311 may compare a phase of the reference signal FREF with a phase of the feedback signal FEED and output a first detection signal UP1 based on a comparison result.

Referring to FIGS. 3 and 4, when a phase of the reference signal FREF leads a phase of the feedback signal FEED in each of comparison time points CP1 to CP4, a first detection signal UP1 having a high level H (or a late state Late) may be output. In contrast, when the phase of the reference signal FREF lags behind the phase of the feedback signal FEED, a first detection signal UP1 having a low level L (an early state Early) may be output. The accumulation circuit 312 may output a first control signal DCW1 to the first DCDL 313 in response to the first detection signal UP1. The first DCDL 313 may receive a reference signal FREF, and output a delayed reference signal FREF_DLY of which a delay amount is controlled, in response to the first control signal DCW1.

Similarly, the second BBPD 321 may output a second detection signal UP2 corresponding to a phase difference between the delayed reference signal FREF_DLY and the delayed feedback signal FEED_DLY. For example, in a late state, the second BBPD 321 may output a second detection signal UP2 having a high level H to increase a frequency of the output signal FDCO. In an early state, the second BBPD 321 may output a second detection signal UP2 having a low level L to reduce a frequency of the output signal FDCO. The DLF 323 may transmit a second control signal DCW2 to the DCO 324 in response to the second detection signal UP2. The output signal FDCO generated by the DCO 324 may be externally provided through the post-divider 325 or provided as the feedback signal FEED through the main divider 326.

Each of the first DCDL 313 and the second DCDL 322 may control a delay amount in response to a control signal. In this case, each of the first DCDL 313 and the second DCDL 322 may operate in an enable mode or a disable mode. The delay amount may be controlled in the response to the control signal in the enable mode, and an input signal may be delayed by as much as a desired (or, alternatively, a predetermined) delay amount in the disable mode. In an example embodiment, the first DCDL 313 may operate in response to an enable signal DCDL_EN and/or a lock detection signal LD_OUT, and a delay amount may be controlled in response to the first control signal DCW1. Also, the second DCDL 322 may delay the feedback signal FEED by as much as a desired (or, alternatively, a predetermined) delay amount in response to a control signal |DCW1|max/2 having a fixed value.

Meanwhile, the lock detector 340 may determine whether the DPLL 300 is in a lock state and output a lock detection signal LD_OUT based on a determination result. The lock detector 340 may receive the second detection signal UP2 and the feedback signal FEED, and determine whether the DPLL 300 is in the lock state based on a result of detection of the second detection signal UP2 and the feedback signal FEED. The lock detector 340 may determine the lock state in various manners. For example, the second BBPD 321 may output a second detection signal UP2, which is maintained at a high level or a low level, in an unlock state, while the second BBPD 321 may output a second detection signal UP2, which toggles between the high level and the low level, in the lock state. Thus, the lock detector 340 may determine the lock state by monitoring the second detection signal UP2. Alternatively, the lock detector 340 may determine the lock state by monitoring a frequency variation state of the feedback signal FEED.

As described above, the enabling of the first DCDL 313 may be controlled in response to a lock detection signal LD_OUT. For example, the first DCDL 313 may be selectively enabled in a lock state of the DPLL 300.

Meanwhile, the AFC circuit 350 may be enabled in an operation initial period (e.g., an AFC mode) of the DPLL 300. In the AFC mode, the AFC circuit 350 may compare a phase and/or frequency of the reference signal FREF with a phase and/or frequency of the feedback signal FEED, generate a control code AFC_CODE based on a comparison result, and provide the control code AFC_CODE to the DCO 324. The control code AFC_CODE may be a digital code for tuning, controlling, or compensating a frequency of an output signal FDCO of the DCO 324. Due to the AFC mode, the DCO 324 may be controlled to operate in a frequency near to a target frequency.

Meanwhile, in the AFC mode, at least some of components other than the AFC circuit 350 may be disabled. For example, at least some of elements included in the FFDLP 310 and at least some of elements included in the PLP 320 may be disabled.

After the AFC mode is ended, the DPLL 300 may operate in a normal mode. A frequency of the output signal FDCO of the DCO 324 may be finely controlled due to an operation of the PLP 320. In the normal mode, the DPLL 300 may enter a lock state. In the lock state, the FFDLP 310 may be enabled and perform an operation of generating a delayed reference signal FREF_DLY, which is tracked to the feedback signal FEED. As in the above-described embodiment, the output signal FDCO output in the lock state may include a jitter. According to the present example embodiment, a phase detection operation may be performed on the delayed reference signal FREF_DLY, which is tracked to the output signal FDCO including a jitter, and a frequency and/or a phase of the output signal FDCO is controlled based on a result of the phase detection. Therefore, phase noise of the output signal FDCO may be reduced.

Referring to FIG. 5, a signal waveform relative to the operation of the FFDLP 310 will be described with reference to FIG. 5.

As shown in FIG. 5, the reference signal FREF and the feedback signal FEED may have about the same frequency, and the feedback signal FEED may include a jitter. Due to a tracking operation of the FFDLP 310, the delayed reference signal FREF_DLY may fluctuate in the same way as or a similar way to the jitter included in the feedback signal FEED. Also, the delayed feedback signal FEED_DLY generated by delaying the feedback signal FEED may fluctuate in the same way as or a similar way to the jitter included in the feedback signal FEED. Thus, a value |FREF_DLY−FEED_DLY| corresponding to an input tracking jitter of the PLP 320 may be reduced by the resolution of a DCDL, for example, the first DCDL 313, and a phase noise of the DPLL 300 may be reduced.

Figure 6:
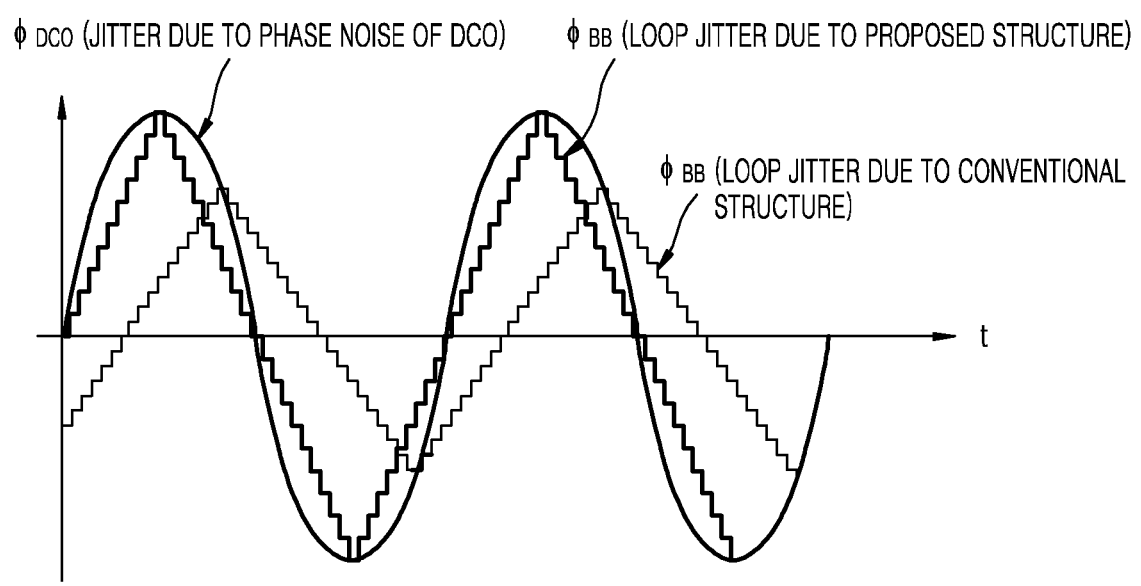
FIG. 6 is a waveform diagram showing an example in which an input tracking jitter is reduced according to an example embodiment of the inventive concepts.

FIG. 6 is a waveform diagram showing an example in which an input tracking jitter is reduced, according to an example embodiment of the inventive concepts.

As shown in FIG. 6, an input tracking jitter may occur due to the phase noise of the output signal FDCO. However, according to the present embodiment, a tracking slew rate may increase due to a secondary delta-sigma modulation operation. Thus, the input tracking jitter may be rapidly reduced.

Figure 7:
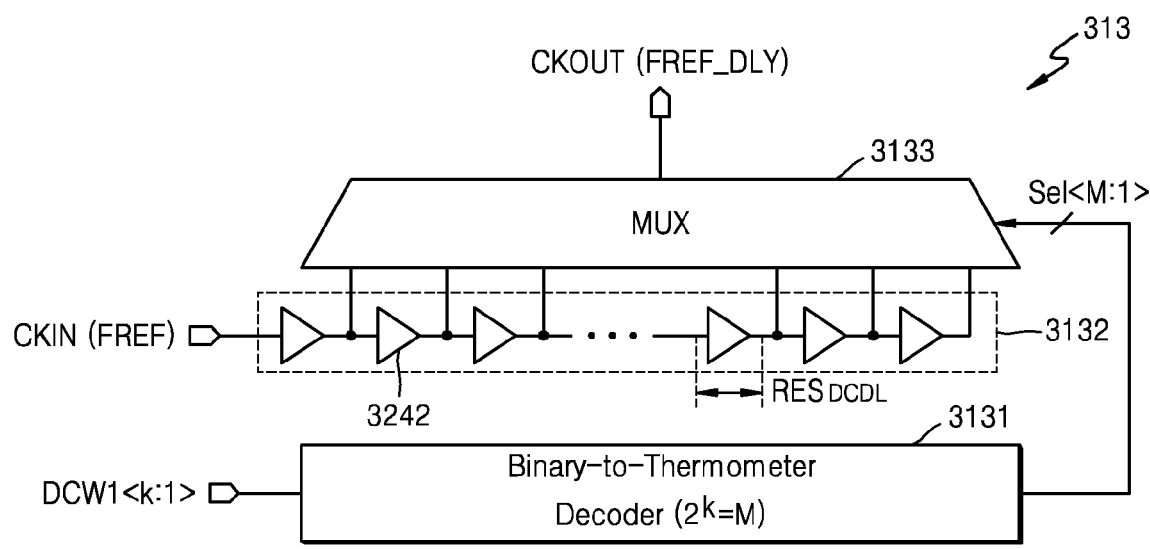
FIG. 7 is a block diagram of a delay-controlled delay line (DCDL) of FIG. 3, according to an example embodiment of the inventive concepts.
Figure 8:
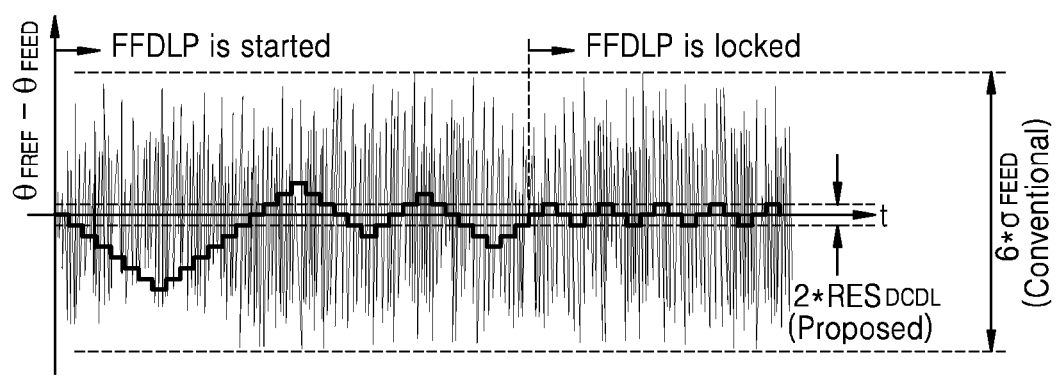
FIG. 8 is a diagram showing an example in which an input tracking jitter is reduced due to the DCDL of FIG. 7.

FIG. 7 is a block diagram of the DCDL 313 of FIG. 3, according to an example embodiment of the inventive concepts, and FIG. 8 is a diagram showing an example in which an input tracking jitter is reduced due to the DCDL 313 of FIG. 7.

Referring to FIG. 7, while FIG. 7 illustrates the first DCDL 313, the second DCDL 322 of FIG. 3 may have the same configuration as or a similar configuration to that of FIG. 7.

The delay-controlled delay line (DCDL) 313 may include a binary-to-thermometer decoder (B2T decoder) 3131, a delay unit 3132 including a plurality of buffers 3242 and a multiplexer 3133. However, example embodiments of the inventive concepts are not limited to the present example embodiment. For example, a DCDL having various shapes, of which a delay amount is controlled in response to a control signal DCW1<k:1>, may be applied to a DPLL according to an example embodiment.

The accumulation circuit 312 may output a digital code including a plurality of bits as a first control signal DCW1<k:1> in response to the first detection signal UP1. The first control signal DCW1<k:1> may have a size of, for example, k bits, and the first control signal DCW1<k:1> having k bits may be provided to the B2T decoder 3131.

The B2T decoder 3131 may decode the first control signal DCW1<k:1>, generate a plurality of selection signals sel<M:1>, and provide the plurality of selection signals sel<M:1> to the multiplexer 3133. Thus, a delay amount of a delayed reference signal FREF_DLY may be controlled according to the digital code used as the first control signal DCW1<k:1>. A desired (or, alternatively, a predetermined) clock signal CKIN may be applied to the delay unit 3132, and respective output signals of the plurality of buffers 3242 of the delay unit 3132 may have different phases. An output signal CKOUT of one selected out of the plurality of buffers may be selected by the multiplexer 3133 in response to selection signals sel<M:1>. In the example shown in FIG. 3, the clock signal CKIN may correspond to a reference signal FREF, and the output signal CKOUT may correspond to a delayed reference signal FREF_DLY.

In the embodiment shown in FIG. 7, the resolution of the DCDL 313 may be determined by the delay amount of the buffer included in the delay unit 3132. To improve the jitter tracking effect of the FFDLP 310, it may be desirable to determine an operation range and resolution of the DCDL 313. The FFDLP 310, which is of a feed-forward type, may not need to cover the entire periods of the reference signal FREF and the feedback signal FEED. That is, since the FFDLP 310 has to cover only the input tracking jitter of the DPLL 300, only a short-term jitter of the DCO 324 may be considered.

Referring to FIG. 8, when the main cause of the short-term jitter is a random noise, a jitter σfeed in the feedback signal FEED may increase sqrt(M) times. Assuming that a peak-to-peak jitter satisfies 6-sigma 6*σfeed, a minimum operation range of the DCDL 313 may correspond to 6*$\sqrt{M}$*σfdco. A loop stability condition may also be considered to determine the resolution of the DCDL 313. Since the FFDLP 310 functions to amplify a difference between a reference signal FREF and a feedback signal FEED, a proportional gain of the PLP 320 may need to be less than the resolution of the DCDL 313. When the jitter tracking of the FFDLP 310 is stabilized, a peak-to-peak input tracking jitter may be reduced from 6-sigma 6*σfeed to 2*RESdcdl.

FIG. 9 shows equations indicating operating characteristics of the DPLL 300 of FIG. 3 to which a secondary sigma modulation is applied, according to an example embodiment of the inventive concepts.

Referring to FIG. 9, when a secondary sigma modulation operation is applied to the DPLL 300 according to example embodiments, an additional pole may be generated on a graph plotting phase noise versus offset frequency. As can be seen from the equations of FIG. 9, the DPLL 300 according to example embodiment may have tertiary loop characteristics. Various values caused by DPLL characteristics according to the example embodiments may be obtained from the equations of FIG. 9. For example, G0(Z) indicates a gain of a first tracking unit 310, G(Z) indicates a gain of a second tracking unit 320, Href(Z) indicates a transfer function of noise transmitted through a reference signal input terminal, and Hdco(Z) indicates a transfer function of noise caused by a DCO 324. Also, Kbbpd indicates a constant determined by a BBPD, Kdcdl indicates a resolution of a DCDL 313, 322, Kacc and Kdlf indicate coefficients of an accumulation circuit 312 and a DLF 323, respectively, and Kdco indicates a resolution of a DCO 324. Also, a constant N indicates a frequency multiplication value of a PLL or a frequency division ratio of a main divider 326.

As shown in FIG. 9, since a secondary sigma loop is applied to the DPLL according to example embodiments, the degree of each of the transfer functions Href(Z) and Hdco(Z) may increase. A filtering effect may be increased due to the transfer function of which the degree is increased, thereby effectively reducing noise. Also, in example embodiments, a value G0(Z) may be controlled according to characteristics of elements included in the first tracking unit 310, so noise filtering characteristics may be variously varied.

Figure 10:
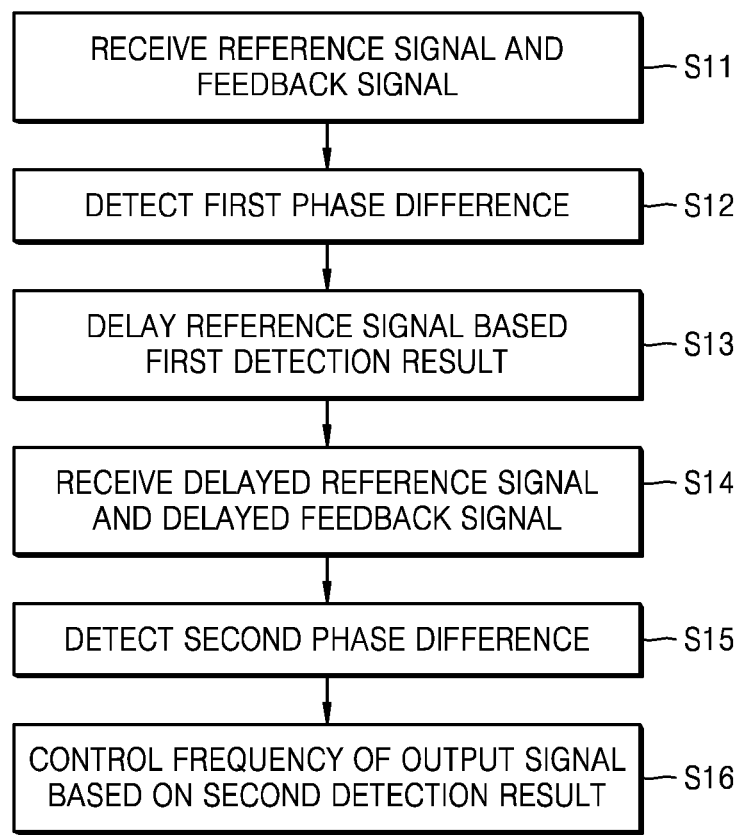
FIG. 10 is a flowchart of a method of operating a DPLL according to an example embodiment of the inventive concepts.

FIG. 10 is a flowchart of a method of operating a DPLL according to an example embodiment of the inventive concepts.

Referring to FIG. 10, the DPLL according to example embodiments may include at least two tracking units.

In operation S11, a first tracking unit may receive a reference signal and a feedback signal. The reference signal may be a signal generated using an external clock signal, and the feedback signal may be a signal generated using an output signal of the DPLL, namely, a signal generated by dividing the output signal of the DPLL.

In operation S12, the first tracking unit may detect a first phase difference between the reference signal and the feedback signal, and output a first detection result based on the first phase difference.

In operation S13, the first tracking unit may delay the reference signal based on the first detection result, and output the delayed reference signal. In an example, the first tracking unit may include a DCDL, which may receive the reference signal and control a delay amount of the reference signal based on the first detection result.

Meanwhile, in operation S14, a second tracking unit may receive a delayed reference signal and a delayed feedback signal. The delayed reference signal may be an output signal output by the DCDL of the first tracking unit. Also, the delayed feedback signal may be a signal generated by delaying the feedback signal. The DCDL for delaying the feedback signal may be included in the first tracking unit or included in the second tracking unit. Alternatively, the DCDL for delaying the feedback signal may be included outside the first and second tracking units.

In operation S15, the second tracking unit may detect a second phase difference between the delayed reference signal and the delayed feedback signal, and output a second detection result based on the second phase difference.

In operation S16, the second tracking unit may control a frequency (and/or a phase) of an output signal based on the second detection result. The second tracking unit may include a DCO, which may be controlled in response to a digital signal generated by accumulating the second detection result. A second delta-sigma modulation operation may be performed on the first and second tracking units, so that a phase noise of the output signal generated by the DCO may be reduced.

Figure 11:
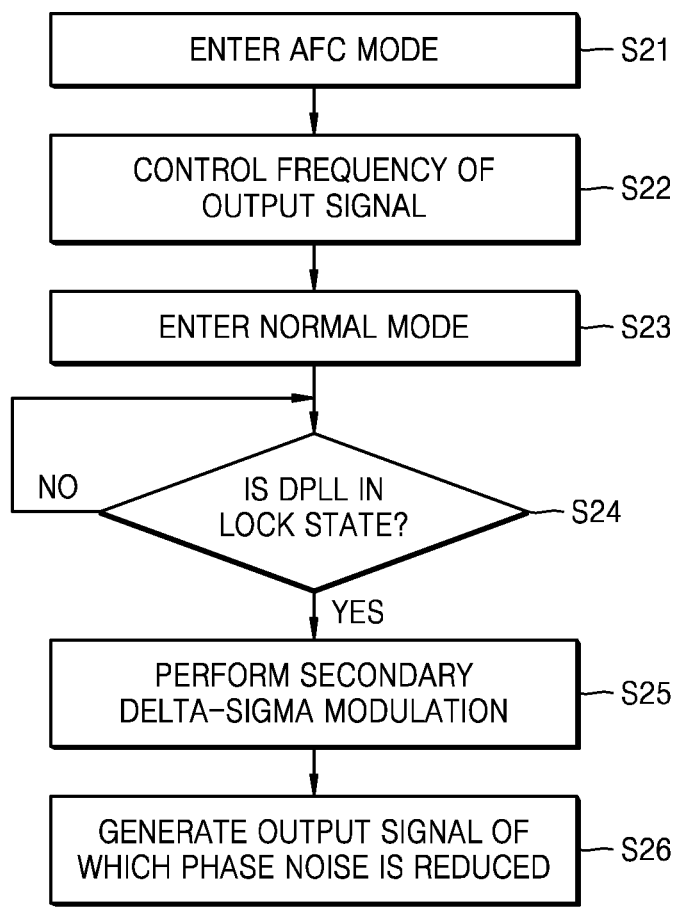
FIG. 11 is a flowchart of a method of operating a DPLL according to another example embodiment of the inventive concepts.

FIG. 11 is a flowchart of a method of operating a DPLL according to another example embodiment of the inventive concepts.

An operation of the DPLL according to example embodiments may be controlled in various modes.

In operation S21, during an initial operation of the DPLL, the DPLL may enter an AFC mode.

In operation S22, when in the AFC mode, an AFC circuit included in the DPLL may control a frequency of an output signal according to a control code generated based on a result of comparison of a phase and/or frequency of a reference signal with a phase and/or frequency of a feedback signal. Due to the AFC mode, a DCO included in the DPLL may be controlled to operate in a frequency near to a target frequency.

In operation S23, the DPLL may enter a normal mode as the AFC mode is ended.

In operation S24, in the normal mode, the DPLL may finely control a frequency of an output signal based on the result of comparison of the phase and/or frequency of the reference signal with the phase and/or frequency of the feedback signal, and determine whether to enter a lock state depending on characteristics of the output signal.

When the DPLL is not in the lock state based on the determination result, the above-described comparison and frequency control operations may be repeated.

In operation S25, as the DPLL enters the lock state, a secondary delta-sigma modulation operation according to an example embodiment.

Also, in operation S26, according to the above-described example embodiment, the DPLL may generate an output signal of which a phase noise is reduced.

Figure 12:
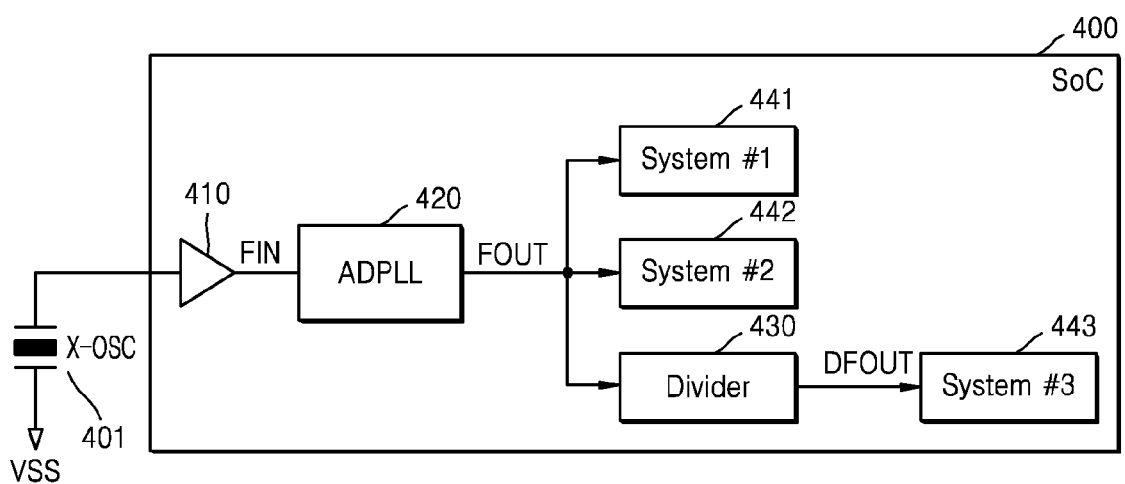
FIG. 12 is a block diagram of a system-on chip (SoC) including a DPLL according to an example embodiment of the inventive concepts.

FIG. 12 is a block diagram of a system-on chip (SoC) 400 including a DPLL 420 according to an example embodiment of the inventive concepts.

Referring to FIG. 12, the SoC 400 may include a buffer 410, the DPLL 420, a plurality of systems 441 to 443, and a divider 430. FIG. 12 illustrates an example in which an all-digital PLL (ADPLL) is applied as the DPLL 420.

The buffer 410 may buffer an output signal of a crystal oscillator 401 included outside the SoC 400, and generate an input clock signal FIN. As in the above-described embodiment, the DPLL 420 may detect a variation in phase of a feedback signal, and generate an output clock signal FOUT based on a detection result. According to the present example embodiment, the DPLL 420 may be a DPLL to which a secondary sigma loop is applied. Thus, a first tracking operation using a reference signal and a feedback signal and a second tracking operation using a delayed reference signal and a delayed feedback signal may be performed.

Each of the plurality of systems 441 to 443 may operate in response to the output clock signal FOUT. The divider 430 may divide the output clock signal FOUT in a desired (or, alternatively, a predetermined) division ratio and provide the divided output clock signal FOUT to at least one system, for example, the system 443. Each of the systems 441 to 443 may be embodied by hardware or a circuit that may operate by using the output clock signal FOUT or a signal related to the output clock signal FOUT.

For example, the system 441 may be a central processing unit (CPU), a processor, or an application processor (AP), the system 442 may be a graphic processing unit (GPU), and the system 443 may be a memory device or a memory controller.

Meanwhile, each of the systems 441 to 443 may be other devices used for the SoC 400, for example, a CPU, a processor, each core of a multi-core processor, a memory device, a universal serial bus (USB), a peripheral component interconnect (PCI), a digital signal processor, a wired interface, a wireless interface, a controller, embedded software, a codec, a video module (e.g., a camera interface, a joint photographic experts group (JPEG) processor, a video processor, or a mixer), a 3-dimensional (3D) graphic core, an audio system, or a driver. Also, the SoC 400 may be a portion of an access point AP or a portion of a mobile AP.

Figure 13:
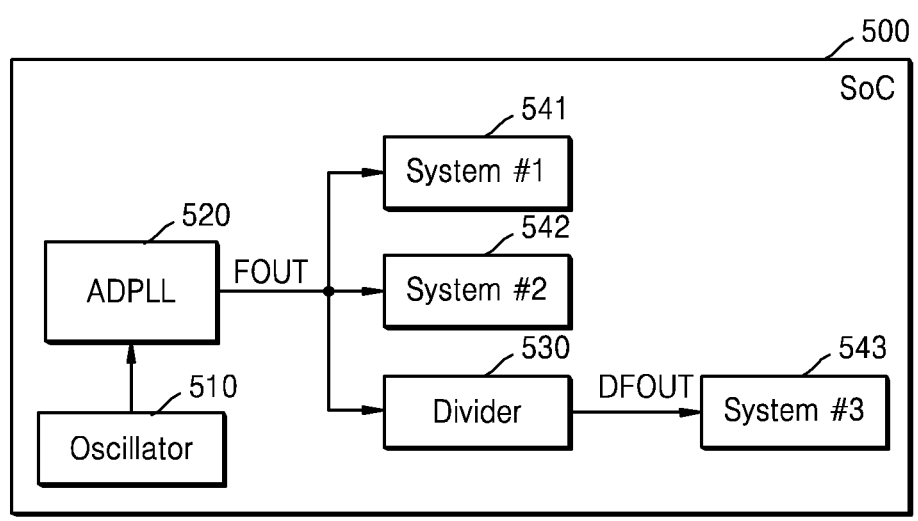
FIG. 13 is a block diagram of an SoC including a DPLL according to another example embodiment of the inventive concepts.

FIG. 13 is a block diagram of a SoC 500 including a DPLL according to another exemplary embodiment of the inventive concept.

Referring to FIG. 13, the SoC 500 of FIG. 13 may include an oscillator 510, a DPLL 520, a plurality of systems 541 to 543, and a divider 530. A structure and function of the SoC 500 of FIG. 13 may be substantially the same as those of the SoC 400 of FIG. 12 except that the oscillator 510 configured to generate an input clock signal FIN is embodied in the SoC 500.

Figure 14:
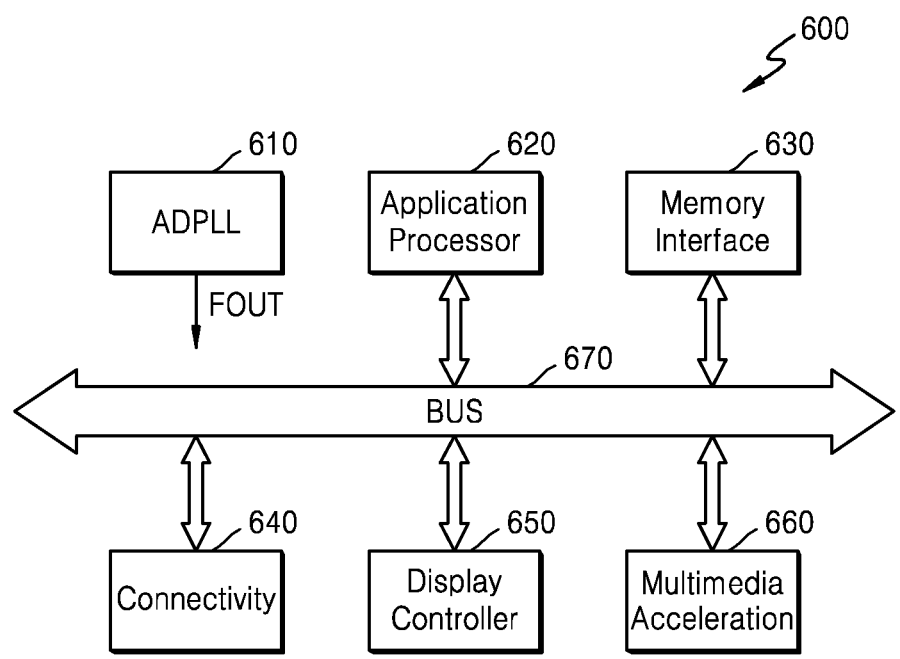
FIG. 14 is a block diagram of an electronic device including a DPLL according to an example embodiment of the inventive concepts.

FIG. 14 is a block diagram of an electronic device 600 including a DPLL according to an example embodiment of the inventive concepts.

Referring to FIG. 14, the electronic device 600 may include an ADPLL 610, an AP 620, a memory interface 630, a connectivity unit 640, a display controller 650, a multimedia acceleration unit 660, and a system bus 670. The ADPLL 610 may be a PLL according to one of the above-described example embodiments. Thus, the ADPLL 610 may be a DPLL to which a secondary sigma loop is applied. Thus, a first tracking operation using a reference signal and a feedback signal and a second tracking operation using a delayed reference signal and a delayed feedback signal may be performed.

The electronic device 600 may be one of various systems, such as a laptop computer, a mobile phone, a smartphone, a tablet PC, a personal digital assistant (PDA), an enterprise digital assistant (EDA), a digital still camera, a digital video camera, a portable multimedia player (PMP), a personal navigation device or portable navigation device (PND), a handheld game console, or an electronic book (e-book).

The AP 620 may control the memory interface 630, the display controller 650, the connectivity 640, and the multimedia acceleration unit 660 via the system bus 670. The memory interface 630 may include an embedded memory device and a memory controller capable of interfacing with an external memory device. The display controller 650 may transmit data to be displayed on a display device to the display device. The connectivity 640 may include a general purpose input/output (GPIO) interface, a serial peripheral interface (SPI) bus, and/or a universal serial bus on-the-go (USB OTG). Also the multimedia acceleration unit 660 may include a camera interface, a multi-format CODEC, a video pre/post processor, and/or a JPEG.

While example embodiments of the inventive concepts have been particularly shown and described with reference to some example embodiments thereof, it will be understood that various changes in form and details may be made therein without departing from the spirit and scope of the following claims.

What is claimed is:

1. A digital phase-locked loop (DPLL) comprising:
   a first tracking unit configured to receive a reference signal and a feedback signal generated by feeding back an output signal of the DPLL and output a delayed reference signal by tracking the feedback signal; and
   a second tracking unit configured to receive the delayed reference signal and a delayed feedback signal generated by delaying the feedback signal, and generate the output signal of the DPLL, the second tracking unit configured to control a frequency of the output signal of the DPLL according to a phase difference between the delayed feedback signal and the delayed reference signal.

2. The DPLL of claim 1, wherein the first tracking unit comprises:
   a first bangbang phase detector (BBPD) configured to detect a phase difference between the reference signal and the feedback signal, and output a first detection signal based on the phase difference detected by the first BBPD; and
   a first delay-controlled delay line (DCDL) configured to generate the delayed reference signal by delaying the reference signal, based on the phase difference detected by the first BBPD.

3. The DPLL of claim 2, wherein the first tracking unit further comprises:
   an accumulation circuit configured to,
     receive the first detection signal from the first BBPD,
     generate a control signal to delay the reference signal, and
     transmit the control signal to the first DCDL in response to the first detection signal.

4. The DPLL of claim 1, wherein the second tracking unit comprises:
   a second BBPD configured to detect a phase difference between the delayed feedback signal and the delayed reference signal, and output a second detection signal based on the phase difference detected by the second BBPD; and
   a digitally controlled oscillator (DCO) configured to generate the output signal such that the frequency of the output signal is based on the phase difference detected by the second BBPD.

5. The DPLL of claim 4, wherein the second tracking unit further comprises:
   a second DCDL configured to generate the delayed feedback signal by delaying the feedback signal.

6. The DPLL of claim 4, wherein the second tracking unit further comprises:
   a digital loop filter (DLF) configured to,
     receive the second detection signal from the second BBPD, and
     provide a control signal to the DCO to control the frequency of the output signal generated thereby, the control signal varying in response to the second detection signal.

7. The DPLL of claim 1, further comprising:
   a main divider configured to generate the feedback signal by dividing the output signal.

8. The DPLL of claim 1, further comprising:
   a lock detector configured to detect whether the DPLL is in a lock state, and generate a lock detection signal indicating whether the DPLL is in the lock state; and
   an automatic frequency control (AFC) circuit configured to control the frequency of the output signal based on a phase difference between the reference signal and the feedback signal.

9. The DPLL of claim 8, wherein
   the lock detector is configured to provide the lock detection signal to the first tracking unit, and
   the first tracking unit is configured to perform a tracking operation when the lock detection signal indicates that the DPLL is in the lock state.

10. The DPLL of claim 8, wherein
    the first tracking unit is configured to output the delayed reference signal such that,
      the delayed reference signal has a constant delay amount with respect to the reference signal, when the DPLL is in an unlock state, and
      the delayed reference signal has a variable delay amount with respect to the reference signal based on a tracking result, when the DPLL is in a lock state.

11. A digital phase-locked loop (DPLL) comprising:
    a feed-forward delay-locked part (FFDLP) configured to receive a reference signal and a feedback signal generated by feeding back an output signal of the DPLL, and output a delayed reference signal by tracking the feedback signal, when the DPLL is in a lock state; and
    a phase-locked part (PLP) configured to receive the delayed reference signal and a delayed feedback signal generated by delaying the feedback signal, and generate the output signal of the DPLL.

12. The DPLL of claim 11, wherein the FFDLP is configured to generate the delayed reference signal by controlling a delay amount for the reference signal according to a phase difference between the reference signal and the feedback signal.

13. The DPLL of claim 11, wherein the PLP is configured to control a frequency of the output signal of the DPLL according to a phase difference between the delayed feedback signal and the delayed reference signal.

14. The DPLL of claim 13, wherein the PLP receives the delayed reference signal generated by tracking the feedback signal and the delayed feedback signal generated by delaying the feedback signal, and generates the output signal,
    wherein the PLP reduces phase noise of the output signal due to a reduced input tracking jitter.

15. The DPLL of claim 11, further comprising:
    a lock detector configured to detect whether the DPLL is in a lock state based on a phase difference between the delayed feedback signal and the delayed reference signal.

16. A Digital Phase-Locked Loop (DPLL) configured to lock a frequency of a digitally controlled oscillator to a frequency of a feedback signal, the DPLL comprising:
    a first circuit configured to receive a reference signal and the feedback signal, and to output a delayed reference signal such that the delayed reference signal is a delayed version of the reference signal that tracks jitters in the feedback signal; and a second circuit configured to,
  receive the delayed reference signal and a delayed feedback signal, the delayed feedback signal being a delayed version of the feedback signal, and
  generate an output signal based on the delayed reference signal and the delayed feedback signal such that phase noise in the output signal is reduced due to the delayed reference signal tracking the jitters in the feedback signal.

17. The DPLL of claim 16, wherein the second circuit comprises:
  the digitally controlled oscillator (DCO) configured to control a frequency of the output signal based on a phase difference between the delayed feedback signal and the delayed reference signal.

18. The DPLL of claim 17, wherein the second circuit further comprises:
  a bangbang phase detector (BBPD) configured to detect the phase difference between the delayed feedback signal and the delayed reference signal, and output a detection signal based thereon, and
  the DCO is configured to control the frequency of the output signal based on the detection signal.

19. The DPLL of claim 18, wherein the DPPL further comprising:
  a lock detector configured to detect whether the DPLL is in a lock state or an unlock state based on a difference between a frequency of the feedback signal and a frequency of the reference signal, and wherein
    the first circuit includes a delay circuit configured to generate the delayed reference signal by delaying the reference signal a constant amount if the DPLL is in the unlock state, and delaying the reference signal a variable amount based on the jitter, if the DPLL is in the lock state.

20. The DPLL of claim 19, wherein the delay circuit comprises:
  a plurality of buffers each configured to delay the reference signal by a unit.

* * * * *